United States Patent
Choi

(10) Patent No.: US 10,347,310 B2
(45) Date of Patent: Jul. 9, 2019

(54) COMPOSITE FREE LAYER FOR MAGNETORESISTIVE RANDOM ACCESS MEMORY

(71) Applicant: SanDisk Technologies LLC, Plano, TX (US)

(72) Inventor: Young-Suk Choi, Los Gatos, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/613,129

(22) Filed: Jun. 2, 2017

(65) Prior Publication Data

US 2018/0350416 A1    Dec. 6, 2018

(51) Int. Cl.
| | |
|---|---|
| H01L 43/08 | (2006.01) |
| H01L 43/10 | (2006.01) |
| H01L 27/22 | (2006.01) |
| G11C 11/16 | (2006.01) |
| G11C 11/18 | (2006.01) |

(Continued)

(52) U.S. Cl.
CPC ........ *G11C 11/161* (2013.01); *G11C 11/1673* (2013.01); *G11C 11/1675* (2013.01); *G11C 11/18* (2013.01); *H01L 43/04* (2013.01); *H01L 43/06* (2013.01); *H01L 43/08* (2013.01); *H01L 43/10* (2013.01)

(58) Field of Classification Search
CPC ....... H01L 27/222; H01L 27/11; H01L 27/20; H01L 43/04; H01L 43/065; H01L 43/14; H01L 29/82; H01L 2924/1434; H01L 2924/1443; H01L 43/08; H01L 43/10; H01L 43/06; G11C 11/161; G11C 11/1675; G11C 11/1673
See application file for complete search history.

(56) References Cited

U.S. PATENT DOCUMENTS

| | | |
|---|---|---|
| 7,075,760 B2 | 7/2006 | Gill |
| 8,057,925 B2 | 11/2011 | Horng et al. |
| 8,183,653 B2 | 5/2012 | Peng et al. |

(Continued)

FOREIGN PATENT DOCUMENTS

| | | |
|---|---|---|
| WO | 2016011435 A1 | 1/2016 |
| WO | 2016209226 A1 | 12/2016 |

OTHER PUBLICATIONS

S. Ikeda et al., A perpendicular-anisotropy CoFeB—MgO magnetic tunnel junction, Nature Materials 9, 721-724 (2010).

(Continued)

*Primary Examiner* — Caridad Everhart
(74) *Attorney, Agent, or Firm* — Kunzler Bean & Adamson, PC

(57) ABSTRACT

Apparatuses, systems, and methods are disclosed for magnetoresistive random access memory. A magnetic tunnel junction for storing data includes a fixed layer, a barrier layer, and a composite free layer. A barrier layer is disposed between a fixed layer and a composite free layer. A composite free layer includes an in-plane anisotropy free layer, a perpendicular magnetic anisotropy (PMA) inducing layer, and a ferromagnetic amorphous layer. A PMA-inducing layer may be disposed such that an in-plane anisotropy free layer is between a barrier layer and the PMA-inducing layer. A ferromagnetic amorphous layer may be disposed between an in-plane anisotropy free layer and a PMA-inducing layer.

20 Claims, 8 Drawing Sheets

(51) Int. Cl.
*H01L 43/04* (2006.01)
*H01L 43/06* (2006.01)

(56) References Cited

U.S. PATENT DOCUMENTS

| | | |
|---|---|---|
| 9,159,908 B2 | 10/2015 | Cao et al. |
| 9,184,375 B1 | 11/2015 | Tang et al. |
| 9,218,864 B1 | 12/2015 | Yi et al. |
| 9,502,087 B2 | 11/2016 | Buhrman et al. |
| 2011/0006384 A1* | 1/2011 | Peng ................ B82Y 25/00 257/421 |
| 2012/0286382 A1* | 11/2012 | Jan ................ G01R 33/098 257/421 |
| 2015/0200003 A1* | 7/2015 | Buhrman ................ G11C 11/18 365/158 |
| 2015/0228891 A1 | 8/2015 | Park et al. |
| 2016/0225423 A1 | 8/2016 | Naik et al. |
| 2016/0232959 A1 | 8/2016 | Lee et al. |
| 2016/0300999 A1 | 10/2016 | Yi et al. |
| 2018/0351087 A1 | 12/2018 | Choi |

OTHER PUBLICATIONS

Viktor Sverdlov et al., CMOS-Compatible Spintronic Devices, Institute for Microelectronics, Technische Universit at Wien, Vienna, Austria.

Sebastien Couet et al., Oxygen Scavenging by Ta Spacers in Double-MgO Free Layers for Perpendicular Spin-Transfer Torque Magnetic Random-Access Memory, IEEE Magnetics Letters, vol. 7 (2016).

\* cited by examiner

COMPOSITE FREE LAYER FOR MAGNETORESISTIVE RANDOM ACCESS MEMORY

TECHNICAL FIELD

The present disclosure, in various embodiments, relates to magnetoresistive random access memory and more particularly relates to a composite free layer for magnetoresistive random access memory.

BACKGROUND

Various types of magnetoresistive random access memory (MRAM) store data using magnetic tunnel junctions. A magnetic tunnel junction (MTJ) may include "fixed" and "free" magnetic layers, where a magnetic moment of the free layer may be switched to be parallel or antiparallel to a magnetic moment of the fixed layer. A thin dielectric or barrier layer may separate the fixed and free layers, and current may flow across the barrier layer due to quantum tunneling. A difference in resistance between parallel and antiparallel states allows data to be stored. For example, a low resistance may correspond to a binary "1" and a high resistance may correspond to a binary "0," Alternatively, a low resistance may correspond to a binary "0" and a high resistance may correspond to a binary "1."

In spin-transfer torque (STT) MRAM, data may be written by passing a spin-polarized electrical current through an MTJ, to change the magnetic moment of the free layer. However, high write currents through the MTJ may accelerate wear of the barrier layer, and spin-polarized read currents may disturb or alter the stored data. By contrast, in spin-orbit torque (SOT) MRAM, data may be written by applying an electrical current through a spin Hall effect material adjacent to the free layer, thus generating a pure spin current for changing the magnetic moment of the free layer. Writing using a pure spin current may improve reliability and data retention compared to STT-MRAM, but high electrical currents for generating the spin current may lead to design problems relating to heating, high power consumption, large transistor sizes for switching large currents, and the like.

SUMMARY

Apparatuses are presented for magnetoresistive random access memory. In one embodiment, a magnetic tunnel junction for storing data includes a fixed layer, a barrier layer, and a composite free layer. In a certain embodiment, a barrier layer is disposed between a fixed layer and a composite free layer. In a further embodiment, a composite free layer includes an in-plane anisotropy free layer, a perpendicular magnetic anisotropy (PMA) inducing layer, and a ferromagnetic amorphous layer. In a certain embodiment, a PMA-inducing layer may be disposed such that an in-plane anisotropy free layer is between a barrier layer and the PMA-inducing layer. In a further embodiment, a ferromagnetic amorphous layer may be disposed between an in-plane anisotropy free layer and a PMA-inducing layer.

Systems are presented for magnetoresistive random access memory. In one embodiment, a magnetoresistive random access memory die includes a plurality of magnetic tunnel junctions. In a certain embodiment, a magnetic tunnel junction includes a reference layer, a barrier layer, and a composite free layer. In a further embodiment, a barrier layer is disposed between a reference layer and a composite free layer. In one embodiment, a composite free layer includes an in-plane anisotropy free layer, a ferromagnetic amorphous layer, and a PMA-inducing layer. In a certain embodiment, an in-plane anisotropy free layer may be in contact with a barrier layer. In a further embodiment, a ferromagnetic amorphous layer may be in contact with an in-plane anisotropy free layer. In some embodiments, a PMA-inducing layer may be in contact with a ferromagnetic amorphous layer.

An apparatus, in another embodiment, includes means for storing data in a composite free layer for a magnetic tunnel junction, based on an orientation of an in-plane magnetic moment for the composite free layer. In a certain embodiment, an apparatus includes means for permanently inducing a PMA for a composite free layer. In a further embodiment, an apparatus includes means for separating a means for storing data from a means for permanently inducing a PMA, such that a crystal structure of the means for storing data is unaffected by the means for permanently inducing a PMA.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
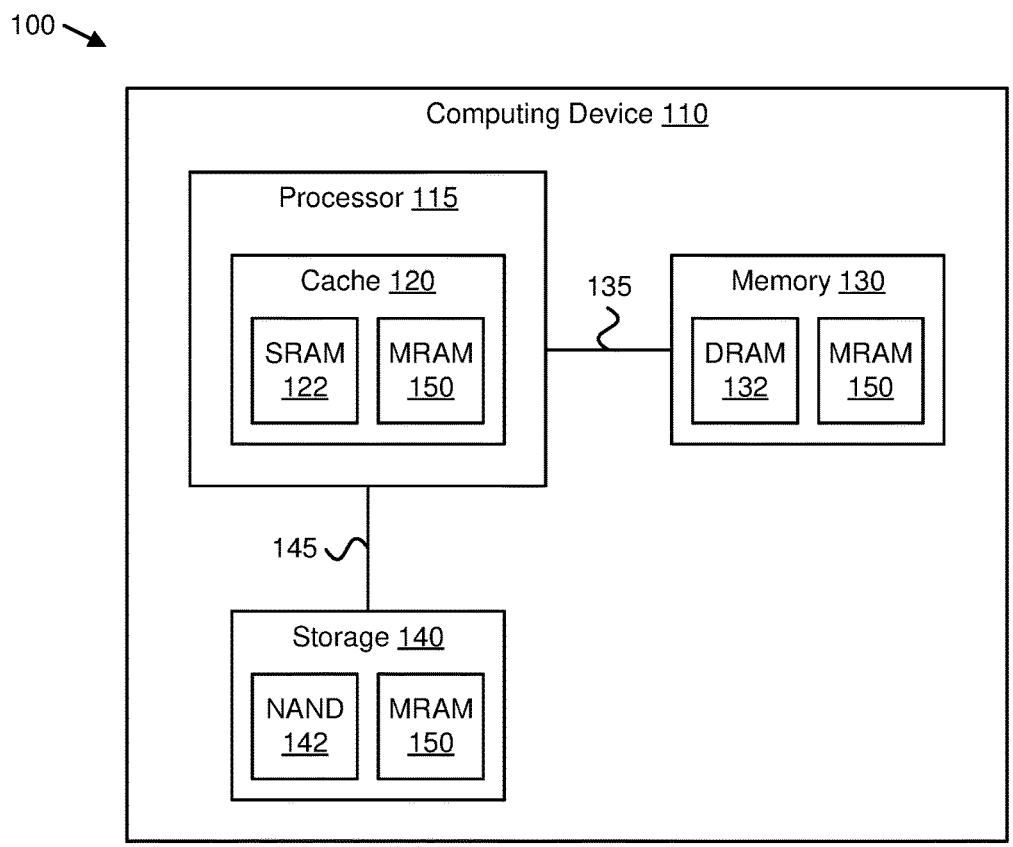
FIG. 1 is a schematic block diagram of one embodiment of a system comprising magnetoresistive random access memory (MRAM)

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 depicts a system 100 comprising magnetoresistive random access memory (MRAM) 150. In the depicted embodiment, the system includes a computing device 110. In various embodiments, a computing device 110 may refer to any electronic device capable computing by performing arithmetic or logical operations on electronic data. For example, a computing device 110 may be a server, a workstation, a desktop computer, a laptop computer, a tablet, a smartphone, a control system for another electronic device, a network attached storage device, a block device on a storage area network, a router, a network switch, or the like. In certain embodiments, a computing device 110 may include a non-transitory, computer readable storage medium that stores computer readable instructions configured to cause the computing device 110 to perform steps of one or more of the methods disclosed herein.

In the depicted embodiment, the computing device 110 includes a processor 115, a memory 130, and storage 140. In various embodiments, a processor 115 may refer to any electronic element that carries out the arithmetic or logical operations performed by the computing device. For example, in one embodiment, the processor 115 may be a general-purpose processor that executes stored program code. In another embodiment, a processor 115 may be a field-programmable gate array (FPGA), an application-specific integrated circuit (ASIC), or the like, that operates on data stored by the memory 130 and/or the storage 140. In a certain embodiment, a processor 115 may be a controller for a storage device (e.g., on a storage area network) a networking device, or the like.

In the depicted embodiment, the processor 115 includes a cache 120. In various embodiments, a cache 120 may store data for use by the processor 115. In certain embodiments, a cache 120 may be smaller and faster than the memory 130, and may duplicate data in frequently-used locations of the memory 130, or the like. In certain embodiments, a processor 115 may include a plurality of caches 120. In various embodiments, a cache 120 may include one or more types of memory media for storing data, such as static random access memory (SRAM) 122, magnetoresistive random access memory (MRAM) 150, or the like. For example, in one embodiment, a cache 120 may include SRAM 122. In another embodiment, a cache 120 may include MRAM 150. In a certain embodiment, a cache 120 may include a combination of SRAM 122, MRAM 150, and/or other memory media types.

The memory 130, in one embodiment, is coupled to the processor 115 by a memory bus 135. In certain embodiments, the memory 130 may store data that is directly addressable by the processor 115. In various embodiments, a memory 130 may include one or more types of memory media for storing data, such as dynamic random access memory (DRAM) 132, MRAM 150, or the like. For example, in one embodiment, a memory 130 may include DRAM 132. In another embodiment, a memory 130 may include MRAM 150. In a certain embodiment, a memory 130 may include a combination of DRAM 132, MRAM 150, and/or other memory media types.

The storage 140, in one embodiment, is coupled to the processor 115 by a storage bus 145. In certain embodiments, the storage bus 145 may be a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In various embodiments, the storage 140 may store data that is not directly addressable by the processor 115, but that may be accessed via one or more storage controllers. In certain embodiments, the storage 140 may be larger than the memory 130. In various embodiments, a storage 140 may include one or more types of storage media for storing data, such as a hard disk drive, NAND flash memory 142, MRAM 150, or the like. For example, in one embodiment, a storage 140 may include NAND flash memory 142. In another embodiment, a storage 140 may include MRAM 150. In a certain embodiment, a storage 140 may include a combination of NAND flash memory 142, MRAM 150, and/or other storage media types.

In various embodiments, MRAM 150 may be used to store data in a cache 120, memory 130, storage 140, and/or another component that stores data. For example, in the depicted embodiment, the computing device 110 includes MRAM 150 in the cache 120, memory 130, and storage 140. In another embodiment, a computing device 110 may use MRAM 150 for memory 130, and may use other types of memory or storage media for cache 120 or storage 140. Conversely, in another embodiment, a computing device 110 may use MRAM 150 for storage 140, and may use other types of memory media for cache 120 and memory 130. Additionally, some types of computing device 110 may include memory 130 without storage 140 (e.g., in a microcontroller) if the memory 130 is non-volatile, may include memory 130 without a cache 120 for specialized processors 115, or the like. Various combinations of cache 120, memory 130, and/or storage 140, and uses of MRAM 150 for cache 120, memory 130, storage 140, and/or other applications will be clear in view of this disclosure.

In various embodiments, the MRAM 150 may include one or more chips, packages, die, or other integrated circuit devices comprising magnetoresistive memory, disposed on one or more printed circuit boards, storage housings, and/or other mechanical and/or electrical support structures. For example, one or more dual inline memory modules (DIMMs), one or more expansion cards and/or daughter cards, a solid-state-drive (SSD) or other storage device, and/or another memory and/or storage form factor may comprise the MRAM 150. The MRAM 150 may be integrated with and/or mounted on a motherboard of the computing device 110, installed in a port and/or slot of the computing device 110, installed on a different computing device 110 and/or a dedicated storage appliance on a network, in communication with a computing device 110 over an external bus, or the like.

The MRAM 150, in various embodiments, may include one or more MRAM die, including a plurality of magnetic tunnel junctions (MTJs) for storing data. In certain embodiments, an MTJ comprises a fixed layer, a barrier layer, and a composite free layer. A composite free layer may include an in-plane anisotropy free layer, a ferromagnetic amorphous layer and a perpendicular magnetic anisotropy (PMA) inducing layer. In certain embodiments, a composite free layer that includes an in-plane anisotropy free layer, a ferromagnetic amorphous layer and a PMA-inducing layer may decrease write currents and power consumption, as compared to an MTJ with a non-composite free layer, while providing a tunnel magnetoresistance (TMR) ratio (e.g., a measurement of a difference between high resistance and low resistance states and antiparallel states) suitable for reading stored data. MRAM 150 is described in further detail below with regard to FIGS. 2 through 9.

Figure 2:
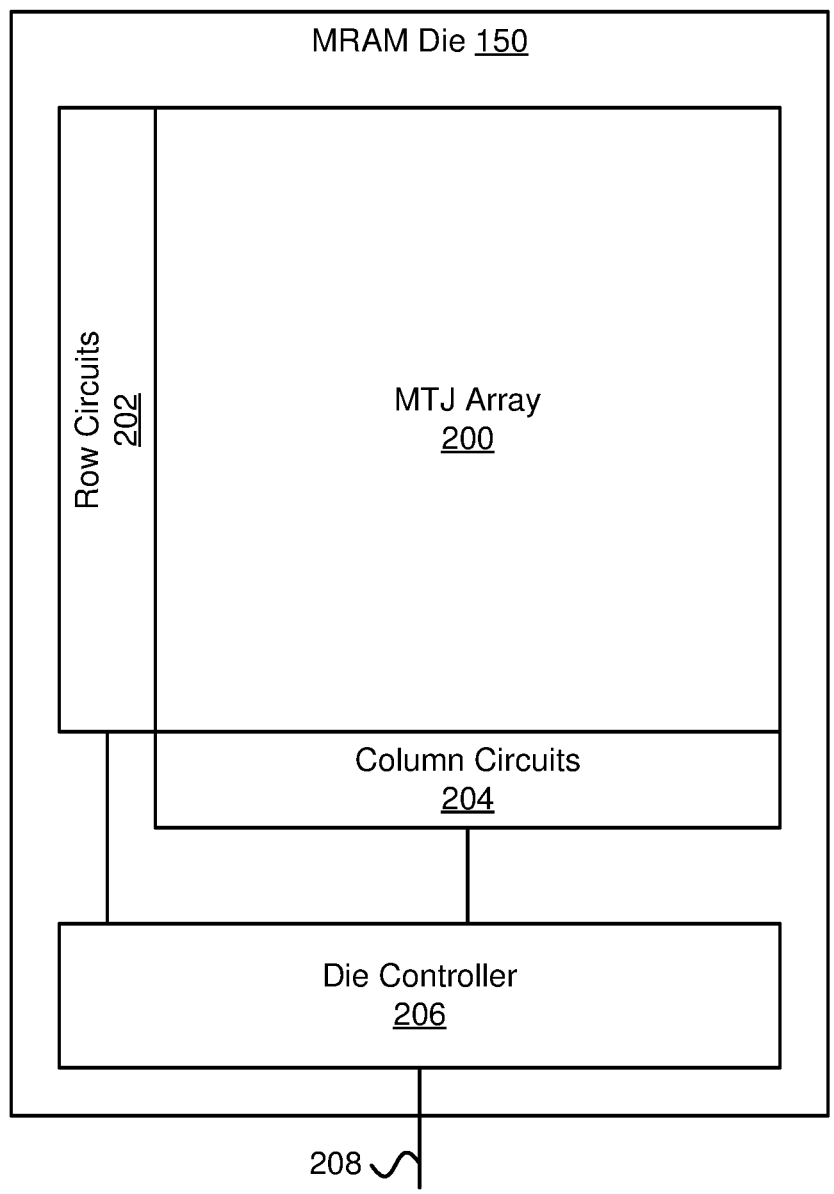
FIG. 2 is a schematic block diagram illustrating one embodiment of an MRAM die.

FIG. 2 depicts one embodiment of an MRAM die 150. The MRAM die 150 may be substantially similar to the MRAM 150 described with reference to FIG. 1. The MRAM die 150, in the depicted embodiment, includes an array 200 of magnetic tunnel junctions, row circuits 202, column circuits 204, and a die controller 206.

In various embodiments, an MRAM die 150 may refer to an integrated circuit that includes both a core array 200 of MRAM cells (e.g., MTJs) for magnetoresistive data storage, and peripheral components (e.g., row circuits 202, column circuits 204, and/or die controller 206) for communicating with the array 200. In certain embodiments, one or more MRAM die 150 may be included in a memory module, a storage device, or the like.

In the depicted embodiment, the array 200 includes a plurality of magnetic tunnel junctions for storing data. In one embodiment, the array 200 may be a two-dimensional array. In another embodiment, the array 200 may be a three-dimensional array that includes multiple planes and/or layers of MTJs. In various embodiments, the array 200 may be addressable by rows (e.g., word lines) via row circuits 202, and by columns (e.g., bit lines) via column circuits 204.

The die controller 206, in certain embodiments, cooperates with the row circuits 202 and the column circuits 204 to perform memory operations on the array 200. In various embodiments, the die controller 206 may include components such as a power control circuit that controls the power and voltages supplied to the row circuits 202 and column circuits 204 during memory operations, an address decoder that translates a received address to a hardware address used by the row circuits 202 and column circuits 204, a state machine that implements and controls the memory operations, and the like. The die controller 206 may communicate with a computing device 110, a processor 115, a bus controller, a storage device controller, a memory module controller, or the like, via line 208, to receive command and address information, transfer data, or the like.

Figure 3:
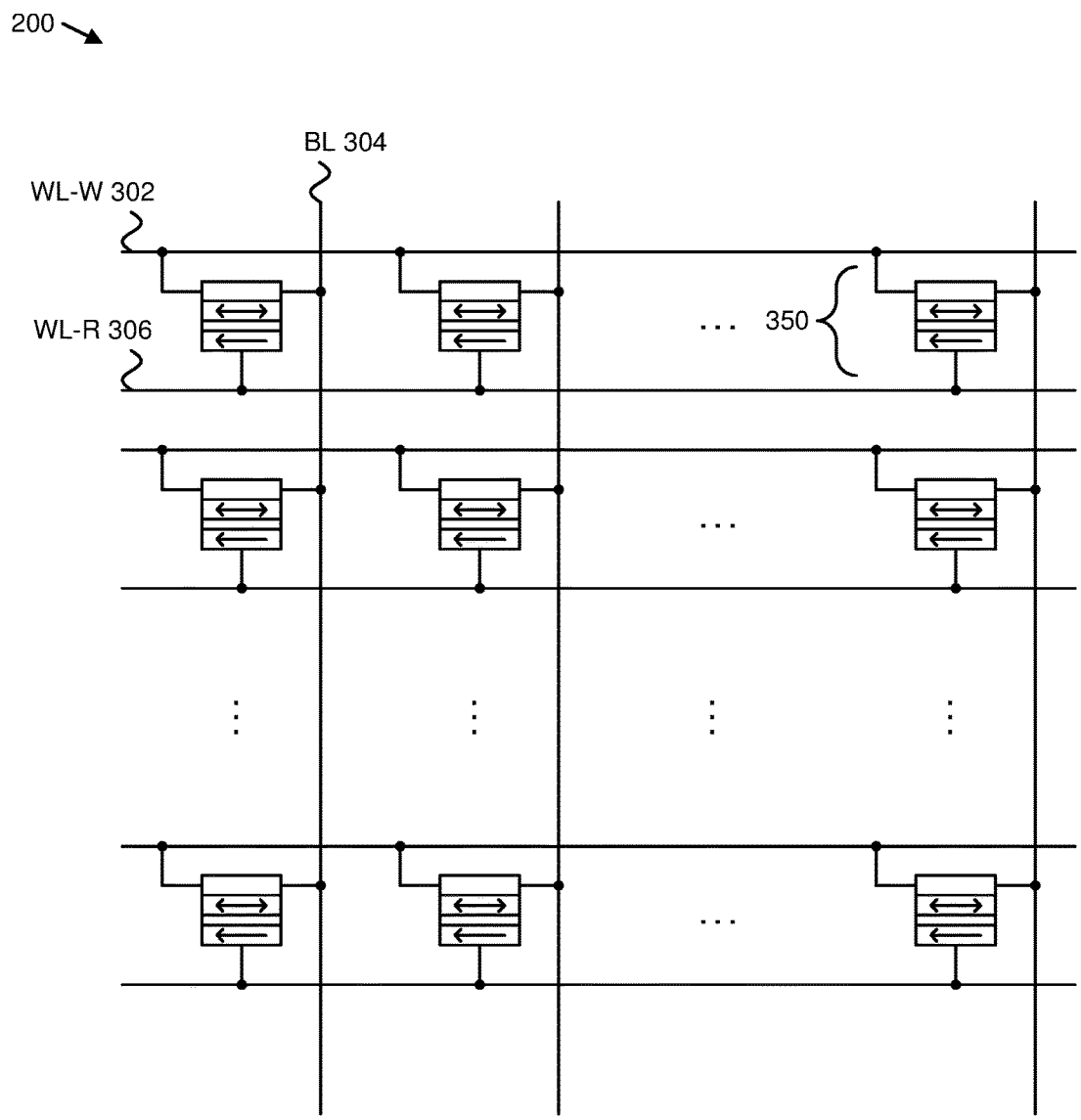
FIG. 3 is a schematic diagram illustrating one embodiment of a magnetic tunnel junction array.

FIG. 3 depicts one embodiment of a magnetic tunnel junction array 200. The MTJ array 200 may be substantially similar to the MTJ array 200 described with reference to FIG. 2. In the depicted embodiment, the MTJ array 200 includes a plurality of MTJs 350 for storing data, coupled to write word lines (WL-W) 302, read word lines (WL-R) 306, and bit lines 304.

An MTJ 350, in the depicted embodiment, includes a fixed or reference layer with a fixed or pinned magnetic moment, indicated by a single-headed arrow. In a further embodiment, an MTJ 350 includes a free layer, with a magnetic moment that can be changed or switched, indicated by a double-headed arrow. A thin dielectric or barrier layer may separate the fixed and free layers, and current may flow across the barrier layer due to quantum tunneling. The probability of an electron tunneling through the barrier layer is higher if the magnetic moments of the fixed and free layers are substantially parallel to each other (referred to herein as the parallel state for the MTJ 350), and lower if the magnetic moments of the fixed and free layers are substantially antiparallel to each other (referred to herein as the antiparallel state for the MTJ 350). Therefore, an electrical resistance through the MTJ 350 may be higher in the antiparallel state than in the parallel state.

In various embodiments, a difference in resistance between parallel and antiparallel states of an MTJ 350 allows data to be stored. For example, a low resistance may correspond to a binary "1" and a high resistance may correspond to a binary "0," Alternatively, a low resistance may correspond to a binary "0" and a high resistance may correspond to a binary "1." The difference between the higher antiparallel resistance and the lower parallel resistance, expressed as a percentage of the lower parallel resistance, may be referred to herein as the tunnel magnetoresistance (TMR), or TMR ratio, for the MTJ 350. Thus, for example, a TMR of 100% would indicate that the antiparallel resistance is double (e.g., 100% greater than) the parallel resistance.

In certain embodiments, a TMR ratio for an MTJ 350 may be related to the difficulty of reading data from the MTJ 350. For example, if the ratio between the antiparallel resistance and the parallel resistance of an MTJ 350 is higher, then a lower read voltage may be sufficient to produce detectably different read currents in the antiparallel and parallel states. Conversely, if the ratio between antiparallel resistance and the parallel resistance of an MTJ 350 is lower, then read currents in the antiparallel and parallel states may not be detectably different unless a higher read voltage is applied. Thus, increasing the TMR of an MTJ 350 (or avoiding factors that may decrease TMR) may facilitate read operations for the MTJ 350.

In the depicted embodiment, the MTJs 350 are spin-orbit torque (SOT) MTJs, for which data may be written by applying an electrical current through a spin Hall effect (SHE) material adjacent to the free layer, thus generating a pure spin current for changing the magnetic moment of the free layer. In various embodiments, an SHE material may refer to any material exhibiting the spin Hall effect, which induces a spin current perpendicular to an electrical current in a material. For example, an in-plane current within a layer of SHE material may cause a spin current across the layer. The direction of the spin current may be controlled based on the direction of the electrical current. Thus, in certain embodiments where an MTJ 350 includes a layer of SHE material adjacent to or in contact with the free layer, an in-plane electric current within the SHE layer may inject a spin current into the free layer, for changing the magnetic moment of the free layer.

In the depicted embodiment, the write word lines 302 and the bit lines 304 are coupled to opposite sides of the SHE layers for the SOT-MTJs 350, such that a voltage difference between a write word line 302 and a bit line 304 induces an in-plane current in the SHE layer of the MTJ 350 at the intersection of the write word line 302 and a bit line 304.

Thus, writing data to an MTJ 350 at the intersection of a selected write word line 302 and a selected bit line 304 may include applying a program voltage to the selected write word line 302, and a zero (or other reference) voltage to the selected bit line 304, so that electrical current in the SHE layer of the MTJ 350 causes a spin current in the free layer, for changing the magnetic moment of the free layer.

In various embodiments, the MTJ array 200 may include transistors, selectors, or the like that prevent stray currents through non-selected MTJs 350 during write operations. For example, in one embodiment, voltages for the non-selected write word lines 302 and the non-selected bit lines 304 may be set to half the program voltage, so that there is no voltage difference between the write word line 302 and the bit line 304 for non-selected MTJs 350 (e.g., MTJs 350 that are not on the selected write word line 302 or the selected bit line 304), and a voltage difference of half the program voltage between the write word line 302 and the bit line 304 for half-selected MTJs 350 (e.g., MTJs 350 that are on either the selected write word line 302 or the selected bit line 304, but not both). In a further embodiment, selectors for the MTJs may not allow current to flow unless the voltage difference between the write word line 302 and the bit line 304 is greater than half the program voltage. Thus, a selector, transistor, or other switching device may allow a write operation to alter stored data in one MTJ 350 without altering stored data values in other MTJs 350.

In another embodiment, data may be written to a row of MTJs 350 simultaneously. For example, the write word line 302 for a row may be grounded, and positive or negative program voltages may be applied to the bit lines 304 to write different data values to the MTJs 350 in the row. Various ways of writing data to individual or multiple MTJs 350, in MTJ arrays 200 using various geometries, will be clear in view of this disclosure.

Reading data from an MTJ 350, in various embodiments, may include measuring, detecting, or sensing a resistance of the MTJ 350 (e.g., indicating whether the MTJ 350 is in a parallel or antiparallel state). For example, in one embodiment, a known voltage may be applied across the free layer, the barrier layer, and the fixed layer, and the resulting current may be measured or sensed to detect the resistance. In another embodiment, a known current may be applied through the free layer, the barrier layer, and the fixed layer, and the resulting voltage drop across the MTJ 350 may be measured or sensed to detect the resistance. In certain embodiments, an MTJ array 200 or MRAM die 150 may include sense amplifiers, latches, and the like, to convert a low power signal from a bit line 304 to a logic level representing a 1 or 0, and store the converted data.

In the depicted embodiment, the read word lines 306 and the bit lines 304 are coupled to the MTJs 350 to apply a current through the free layer, the barrier layer, and the fixed layer. For example, reading data from an MTJ 350 at the intersection of a selected read word line 306 and a selected bit line 304 may include applying a read voltage to the selected read word line 306, and a zero (or other reference) voltage to the selected bit line 304, so that the resistance through the MTJ 350 may be sensed. As described above for write operations, selectors, transistors, or the like may prevent stray currents through non-selected MTJs 350 during read operations. Additionally, data may be read from a row of MTJs 350 simultaneously. For example, a read voltage may be applied to a read word line 306 for a row, and the bit lines 304 may be grounded, so that the resulting currents are sensed for multiple bit lines 304. Various ways of reading data from individual or multiple MTJs 350, in MTJ arrays 200 using various geometries, will be clear in view of this disclosure.

Figure 4:
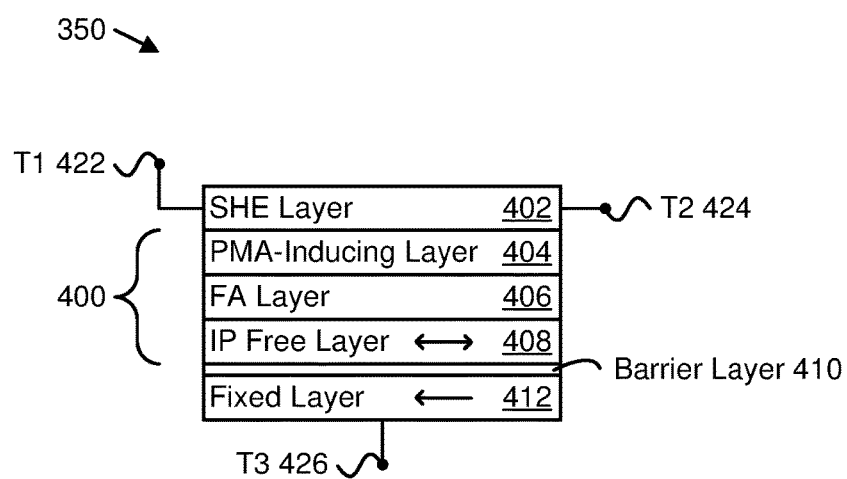
FIG. 4 is a schematic block diagram illustrating one embodiment of a magnetic tunnel junction comprising a composite free layer.

FIG. 4 depicts one embodiment of a magnetic tunnel junction 350 comprising a composite free layer 400. The MTJ 350 may be substantially similar to the MTJ 350 described with regard to FIG. 3. In the depicted embodiment, the MTJ 350 includes a fixed or reference layer 412, a free layer 400, and a barrier layer 410 disposed between the fixed layer and the free layer 400, which may be substantially as described above with regard to FIG. 3. In the depicted embodiment, the free layer 400 is a composite free layer, comprising an in-plane anisotropy free layer 408, a perpendicular magnetic anisotropy (PMA) inducing layer 404, and a ferromagnetic amorphous layer 406. Additionally, in the depicted embodiment, the MTJ further includes a spin Hall effect layer 402, which may be substantially as described above with regard to FIG. 3. In various embodiments, layers of the MTJ 350 may be formed or deposited by various techniques such as physical vapor deposition, sputtering, or the like. In certain embodiments, further layers not shown in FIG. 4, such as a capping layer, may be included in an MTJ 350, or in the process of making an MTJ 350.

The fixed or reference layer 412, in one embodiment, includes a ferromagnetic material with a fixed or pinned magnetic moment. As used herein, the term "ferromagnetic" may be used to refer to any material capable of spontaneous magnetization (e.g., remaining magnetized in the absence of an externally applied magnetic field). Thus, a "ferromagnetic" material may refer to a strictly ferromagnetic material (e.g., for which individual microscopic magnetic moments are fully aligned), or to a ferrimagnetic material (e.g., for which individual microscopic magnetic moments are partially anti-aligned).

In various embodiments, a "fixed" or "pinned" magnetic moment refers to a magnetic moment that is substantially constant, at least in orientation, when the magnetic moment of the free layer 400 is changed or flipped. Thus, for example, in one embodiment, a fixed layer 412 may comprise a ferromagnetic material with a higher coercivity than a ferromagnetic material of a free layer 400. In such an embodiment, an external magnetic field may change the magnetization of both the fixed layer 412 and the free layer 400, but with a larger effect on the free layer 400. In another embodiment, a fixed layer 412 may comprise a ferromagnetic thin film with a magnetic moment pinned by exchange coupling with an antiferromagnet. For example, in one embodiment, a fixed layer 412 may include a synthetic antiferromagnet (e.g., a cobalt/iron and ruthenium multilayer), a ruthenium or iridium spacer, and a ferromagnetic layer comprising a cobalt/iron/boron alloy (CoFeB).

The magnetic moment of the fixed layer 412, in various embodiments, may provide a reference for the orientation of the magnetic moment of the free layer 400. For example, in various embodiments, the total magnetic moment of the free layer 400 may be parallel or antiparallel to the magnetic moment of the fixed layer 412. Thus, the fixed layer 412 is depicted with a reference magnetic moment indicated by a single-headed arrow, and the parallel or antiparallel magnetic moment of the free layer 400 is indicated by a double-headed arrow.

The barrier layer 410, in various embodiments, is disposed between the fixed or reference layer 412 and the free layer 400. In certain embodiments, the barrier layer 410 comprises a dielectric material, such as magnesium oxide (MgO). In certain embodiments, the barrier layer 410 may be less than 20 angstroms thick, so that quantum tunneling of electrons across the barrier layer 410 allows current to flow through the MTJ 350.

In general, in various embodiments, the free layer 400 may comprise a ferromagnetic material with a magnetic moment that can be changed, switched, or flipped, relative to the magnetic moment of the fixed layer 412. As described with regard to FIG. 3, changing the magnetic moment of the free layer 400 changes the electrical resistance of the MTJ 350, allowing data to be stored. In certain embodiments, a ferromagnetic material of the free layer 400 may include a CoFeB alloy. In the depicted embodiment, the free layer 400 is a composite free layer, with components described in further detail below. In certain embodiments, reading data may include applying a current from terminal T2 424 (or terminal T1 422) to terminal T3 426, to sense the resistance of the MTJ 350

The spin Hall effect layer 402, in one embodiment, comprises a spin Hall effect (SHE) material as described above with regard to FIG. 3. In various embodiments, the SHE layer 402 may be described as part of the MTJ 350, or may be described as coupled to an MTJ (where the MTJ itself includes the fixed layer 412, the free layer 400, and the barrier layer 410). In the depicted embodiment, the SHE layer 402 is configured such that an in-plane electric current within the SHE layer 402 causes a spin current in the composite free layer 400. For example, in one embodiment, an electrical current from terminal T1 422 to terminal T2 424 may inject a spin current with a first orientation into the composite free layer 400. In a further embodiment, the opposite electrical current, from terminal T2 424 to terminal T1 422, may inject a spin current with an orientation opposite to the first orientation into the composite free layer 400. A spin current may change or flip the magnetic moment of the free layer 400, for writing data.

In certain embodiments, an electrical current density in the SHE layer 402, for switching the magnetic moment of a non-composite free layer, may be on the order of ten million to one hundred million amperes per square centimeter. High switching current densities may lead to design problems relating to heating, high power consumption, large transistor sizes for switching large currents, and the like. However, switching current density for a free layer 400 with an in-plane magnetic moment is proportional to an effective magnetization of the free layer 400, where the effective magnetization is defined as a saturation magnetization minus a perpendicular magnetic anisotropy. Thus, in certain embodiments, increasing the perpendicular anisotropy of the free layer 400 may reduce a switching current density for the MTJ 350. In various embodiments, a composite free layer 400 may be configured to have an overall in-plane anisotropy, with a perpendicular component to the anisotropy, to reduce switching current for the MTJ.

In the depicted embodiment, the composite free layer 400 includes an in-plane anisotropy free layer 408, a ferromagnetic amorphous layer 406, and a perpendicular magnetic anisotropy (PMA) inducing layer 404. In various embodiments, an in-plane anisotropy free layer 408 may comprise a ferromagnetic material with a changeable, in-plane magnetic moment. For example, in one embodiment, an in-plane anisotropy free layer 408 may include a ferromagnetic CoFeB alloy. The magnetic moment of the in-plane anisotropy free layer 408 may be changed by a spin current from the SHE layer 402, as described above. In certain embodiments, the in-plane anisotropy free layer 408 may be up to 30 angstroms thick. In further embodiments, the in-plane anisotropy free layer 408 may be at least 5 angstroms thick.

As used herein, terms such as "in-plane" and "perpendicular" may be used to describe a direction or orientation (e.g., for a vector quantity such as a magnetic moment, magnetization, current density, or the like), relative to a layer of an MTJ 350. In one embodiment, the term "perpendicular" refers to a direction at right angles to a surface of a layer (e.g., vertically in FIG. 4), and the term "in-plane" refers to a direction parallel to a surface of the layer (e.g., horizontally in FIG. 4). In another embodiment, however, a vector, orientation, or direction may include a combination of perpendicular and in-plane components, and but may be described as either "perpendicular" or "in-plane" based on whether the perpendicular component or the in-plane component has a greater magnitude. For example, in one embodiment, where a magnetic moment includes non-zero in-plane and perpendicular components, it may nevertheless be described as an "in-plane" magnetic moment if the in-plane component is greater than the perpendicular component.

In various embodiments, a magnetic anisotropy may refer to a direction or axis in which magnetization is energetically favorable. For example, in one embodiment, a magnetic anisotropy may refer to a direction of an "easy axis," for magnetizing a ferromagnetic material, where the magnetic moment of the ferromagnetic material tends to be oriented along the "easy axis," but may point in either direction along that axis.

In certain embodiments, the in-plane anisotropy free layer 408 has an in-plane magnetic anisotropy. In further embodiments, the in-plane magnetic anisotropy of the in-plane anisotropy free layer 408 may be parallel or substantially parallel to the magnetic moment of the fixed layer 412. Thus, the magnetic moment of the in-plane anisotropy free layer 408 may be changed by a spin current from the SHE layer 402, but a magnetic moment aligned with the in-plane magnetic anisotropy will be either substantially parallel or substantially antiparallel to the magnetic moment of the fixed layer 412. Thus, in various embodiments, the in-plane anisotropy free layer 408 may store data in the composite free layer 400, based on a parallel or antiparallel orientation of an in-plane magnetic moment.

The PMA-inducing layer 404, in one embodiment, is configured to induce, increase, or add a perpendicular component to the magnetic anisotropy of the composite free layer 400. In certain embodiments, the PMA-inducing layer 404 may permanently add or induce the PMA of the composite free layer 400. As described above, switching current density for writing to the MTJ 350 may be proportional to an effective magnetization of the free layer 400, where the effective magnetization is defined as a saturation magnetization minus a perpendicular magnetic anisotropy. Thus, in certain embodiments, increasing the perpendicular anisotropy may decrease the effective magnetization of the composite free layer 400, thereby decreasing a switching current density for the MTJ 350.

In various embodiments, the PMA-inducing layer 404 may include any of various materials that induce PMA. For example, in one embodiment, the PMA-inducing layer 404 may include a superlattice of alternating "X" and "Y" layers. In one embodiment, the "X" layers may include 0.5 to 10 angstroms of cobalt and/or iron, and the "Y" layers may include 0.5 to 10 angstroms of platinum, palladium, and/or nickel. A number of repeats of the alternating [X/Y] structure may be selected to reduce the effective magnetization of the composite free layer 400 by inducing PMA, while leaving the total magnetic moment of the composite free layer 400 in-plane. In a certain embodiment, for example, the PMA-inducing layer 404 may include a superlattice of alternating cobalt and platinum layers. In a further embodiment, a superlattice of alternating cobalt and platinum layers may include three cobalt layers and three platinum layers. In some embodiments, the cobalt layers may be 3.4 angstroms thick, and the platinum layers may be 1.4 angstroms thick.

In another embodiment, the PMA-inducing layer 404 may include a rare earth and transition metal alloy. For example, in one embodiment, the PMA-inducing layer 404 may include an alloy of cobalt and/or iron (transition metals), with ten to thirty atomic percent of gadolinium (a rare earth metal). In another embodiment, the PMA-inducing layer 404 may include an $L1_0$-phase alloy. In certain embodiments, an $L1_0$ phase for an alloy may refer to a structure similar to a face-centered cubic crystal structure, but ordered with different elements of the alloy in alternating planes. In one embodiment, an $L1_0$-phase alloy for the PMA-inducing layer 404 may include an equi-atomic alloy of "X" and "Y" elements, where the "X" element may be cobalt or iron, and the "Y" element may be platinum, palladium, or nickel. In a certain embodiment, the $L1_0$-phase alloy may be deposited at a temperature above (or equal to) 300 degrees Celsius. In certain embodiments, the PMA-inducing layer 404 may include a combination of sublayers, including a superlattice, a rare earth and transition metal alloy, an $L1_0$-phase alloy and/or further PMA-inducing structures.

In various embodiments, the amount of PMA added to the composite free layer 400 by the PMA-inducing layer 404 may be proportional to (or may increase with) the thickness of the PMA-inducing layer 404. Because the effective magnetization of the composite free layer 400 is equal to the saturation magnetization minus the perpendicular anisotropy, increasing PMA from zero initially decreases effective magnetization of the composite free layer 400, allowing a corresponding reduction in switching currents. However, further increases to PMA, above the saturation magnetization, may increase the effective magnetization and the switching current, as the total magnetic moment of the composite free layer 400 becomes out-of-plane. Therefore, in certain embodiments, a thickness of the PMA-inducing layer 404 is selected such that the PMA-inducing layer 404 reduces an effective magnetization of the composite free layer 400, and such that a total magnetic moment of the composite free layer 400 is in-plane. In various embodiments, a total magnetic moment of the composite free layer 400 may be referred to as in-plane if an in-plane component of the total magnetic moment is greater than a perpendicular component of the total magnetic moment.

In various embodiments, a manufacturer of the MTJ 350 may control the thickness of the PMA-inducing layer 404 by controlling the deposition of one or more individual alloy layers, such as a rare earth and transition metal alloy, or an L10-phase alloy, and/or by controlling the number of repeating layers for a superlattice structure. A "reduction" of effective magnetization, switching current density, or switching current may be in comparison to the composite free layer 400 structure with the PMA-inducing layer 404 omitted.

In the depicted embodiment, the PMA-inducing layer 404 is disposed such that the in-plane anisotropy free layer 408 is between the barrier layer 410 and the PMA-inducing layer 404. For example, the MTJ 350 may be constructed with the fixed layer 412 deposited on a substrate, and the in-plane anisotropy free layer 408 may be above the barrier layer 410, and below the PMA-inducing layer 404. In another embodiment, the MTJ 350 may be constructed with the SHE layer 402 deposited on a substrate, and the in-plane anisotropy free layer 408 may be below the barrier layer 410, and above the PMA-inducing layer 404.

In certain embodiments, crystallization of the in-plane anisotropy free layer 408 may proceed from the interface with the barrier layer 410. For example, in one embodiment, the in-plane anisotropy free layer 408 may be deposited as an amorphous structure, and annealed such that the in-plane anisotropy free layer 408 crystallized in a pseudo-epitaxial relationship with the barrier layer 410. Matching or similar crystal structures (e.g., pseudo-epitaxy) in the fixed layer 412, the barrier layer 410, and the in-plane anisotropy free layer 408 may facilitate quantum tunneling through the barrier layer 410, and a TMR for such a structure may be suitable for reading data. By contrast, crystal orientation mismatches within the in-plane anisotropy free layer 408, or at the interface between the in-plane anisotropy free layer 408 and the barrier layer 410, may hinder quantum tunneling, such that the resistance of the MTJ 350 is high in both the parallel and antiparallel states, and a low TMR for such a structure may make the MTJ 350 less suitable or unsuitable for storing data.

In certain embodiments, the crystal structure of the PMA-inducing layer 404 may be different from the crystal structure of the barrier layer 410. For example, in various embodiments, the barrier layer 410 may have a cubic crystal structure, and the PMA-inducing layer 404 may have a face-centered cubic crystal structure. In a further embodiment, if the PMA-inducing layer 404 were to directly contact the in-plane anisotropy free layer 408, then crystallization proceeding from both sides of the in-plane anisotropy free layer 408 during annealing might cause crystal mismatches within the in-plane anisotropy free layer 408, leading to low TMR for the MTJ 350.

Therefore, in certain embodiments, a ferromagnetic amorphous layer 406 is disposed between the in-plane anisotropy free layer 408 and the PMA-inducing layer 404. For example, in one embodiment, the in-plane anisotropy free layer 408 may be in contact with the barrier layer 410, the ferromagnetic amorphous layer 406 may be in contact with the in-plane anisotropy free layer 408, and the PMA-inducing layer 404 may be in contact with the ferromagnetic amorphous layer 406.

In certain embodiments, the ferromagnetic amorphous layer 406 may include any material that is both ferromagnetic and amorphous. In certain embodiments, ferromagnetic materials of the PMA-inducing layer 404 and the ferromagnetic amorphous layer 406 may conduct a spin current from the SHE layer 402 into the in-plane anisotropy free layer 408. By contrast, non-ferromagnetic materials, such as heavy metal atoms, may scatter a spin current, thus hindering write operations for the MTJ 350.

In certain embodiments, an amorphous structure for the ferromagnetic amorphous layer 406 allows crystallization of the in-plane anisotropy free layer 408 during annealing to be based on the crystal structure of the barrier layer 410, and not on the crystal structure of the PMA-inducing layer 404. For example, the ferromagnetic amorphous layer 406 may separate the in-plane anisotropy free layer 408 from the PMA-inducing layer 404, such that a crystal structure of the in-plane anisotropy free layer 408 is unaffected by the PMA-inducing layer 404. Thus, the ferromagnetic amorphous layer 406 may prevent or mitigate a reduction in TMR for the MTJ 350 that might otherwise occur if the PMA-inducing layer 404 or another non-amorphous layer other than the barrier layer 410 directly contacted the in-plane anisotropy free layer 408.

In one embodiment, the ferromagnetic amorphous layer 406 may include an alloy of one or more ferromagnetic elements, one or more glass-forming elements, and one or more stabilizing elements for preventing migration of the one or more glass-forming elements. (As used herein when referring to an alloy, an "element" refers specifically to a type of atom, not more generally to a component.) A ferromagnetic element may be iron, cobalt, nickel, or any other element exhibiting ferromagnetism. In one embodiment, the one or more ferromagnetic elements may include iron, cobalt, or a combination of iron and cobalt.

In various embodiments, a glass-forming element may refer to any element that tends to interfere with or prevent crystallization of the one or more ferromagnetic elements, such that the ferromagnetic amorphous layer 406 remains in an amorphous solid or glass-like state. For example, in a certain embodiment, the one or more glass-forming elements may include boron. In some embodiments, however, the glass-forming elements may migrate within the ferromagnetic amorphous layer 406 at typical temperatures for annealing the in-plane anisotropy free layer 408, allowing crystallization to begin in regions with a low concentration of glass-forming elements, so that the ferromagnetic amorphous layer 406 is no longer amorphous. Thus, in certain embodiments, the ferromagnetic amorphous layer 406 may include one or more stabilizing elements for preventing migration of the one or more glass-forming elements. (In another embodiment, however, the one or more glass-forming elements may not migrate sufficiently to allow crystallization during annealing, and the one or more stabilizing elements may be omitted)

A stabilizing element, in various embodiments, may include any element that tends to reduce or prevent migration of a glass-forming elements in the ferromagnetic amorphous layer 406. For example, a high chemical affinity between boron and tantalum, titanium, or zirconium may prevent migration of boron within the ferromagnetic amorphous layer 406, thus maintaining an amorphous structure. In one embodiment, the one or more stabilizing elements may include tantalum, titanium, or a combination of tantalum and titanium.

In one embodiment, the ferromagnetic amorphous layer 406 may include an alloy with ten atomic percent or more of the one or more glass-forming elements. In a certain embodiment, the alloy may include five atomic percent or less of the one or more stabilizing elements. In some embodiments, the alloy may include at least three percent of the one or more stabilizing elements.

In one embodiment, the ferromagnetic amorphous layer 406 comprises an alloy of cobalt, iron, and/or nickel, with at least ten atomic percent of boron, and at least three atomic percent of tantalum, titanium, and/or zirconium. In another embodiment, the ferromagnetic amorphous layer 406 comprises an alloy of cobalt, iron, and/or nickel, with at least twenty atomic percent of hafnium, zirconium, silicon, germanium, tantalum, and/or niobium.

In one embodiment, the ferromagnetic amorphous layer 406 comprises an alloy of cobalt, titanium, and boron (CoTiB). In another embodiment, the ferromagnetic amorphous layer 406 comprises an alloy of cobalt, iron, boron, and tantalum (CoFeBTa). In certain embodiments, CoTiB and CoFeBTa alloys may remain amorphous even after annealing at temperatures up to 700 K.

Figure 5:
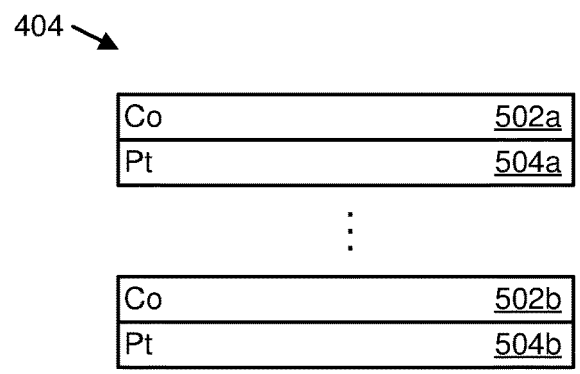
FIG. 5 is a schematic block diagram illustrating one embodiment of a superlattice for a perpendicular magnetic anisotropy (PMA) inducing layer.

FIG. 5 depicts one embodiment of a superlattice for a PMA-inducing layer 404. In various embodiments, a superlattice may refer to a periodic layered structure. In the depicted embodiment, the PMA-inducing layer 404 comprises a superlattice of alternating cobalt layers 502 and platinum layers 504. In various embodiments, a thickness of the individual cobalt layers 502 and platinum layers 504 may be less than 10 angstroms. In one embodiment, the cobalt layers 502 may be 3.4 angstroms thick, and the platinum layers 504 may be 1.4 angstroms thick. A number of repeats of the cobalt layers 502 and platinum layers 504 may be selected or controlled during manufacturing to reduce an effective magnetization of the composite free layer 400 (by inducing PMA) while leaving the total magnetic moment of the composite free layer 400 in-plane.

Figure 6:
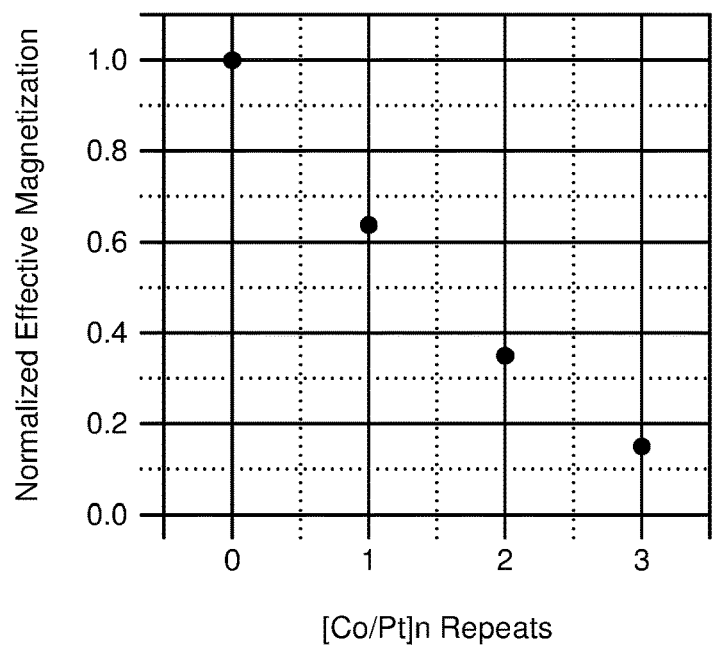
FIG. 6 is a graph illustrating effective magnetization for embodiments of a composite free layer, in relation to superlattice structures for a PMA-inducing layer.

FIG. 6 is a graph depicting effective magnetization for embodiments of a composite free layer 400, in relation to a number of repeats of alternating cobalt and platinum layers for a superlattice of a PMA-inducing layer 404 (e.g., the cobalt layers 502 and platinum layers 504 of FIG. 5). Effective magnetization is normalized in FIG. 6, so that the effective magnetization with zero repeats (e.g., with no PMA-inducing layer 404) is equal to 1. The graph shows decreasing effective magnetization with additional repeats, so that the effective magnetization with three cobalt layers and three platinum layers is between 0.1 and 0.2 of the normalized value. Thus, in certain embodiments, a PMA-inducing layer 404 may reduce the effective magnetization of the composite free layer 400 by a factor of five to ten.

In a further embodiment, switching current for an MTJ may be reduced in proportion to the reduction in the effective magnetization of the composite free layer 400. For example, in one embodiment, switching current density without a PMA-inducing layer 404 may be as high as 50 million amperes per square centimeter, and the PMA-inducing layer 404 may reduce switching current density by an order of magnitude, to five million amperes per square centimeter.

In a certain embodiment, an in-plane electric current within the SHE layer 402 causes a spin current in the composite free layer 400, and the PMA-inducing layer 404 reduces a current density for the in-plane electric current to between one million and ten million amperes per square centimeter. In a further embodiment, the PMA-inducing layer 404 may reduce a current density for the in-plane electric current to between three million and seven million amperes per square centimeter. In a certain embodiment, the PMA-inducing layer 404 may reduce a current density for the in-plane electric current to between four million and six million amperes per square centimeter.

However, excessive repeats of alternating cobalt and platinum layers for a superlattice of a PMA-inducing layer 404 may induce enough PMA that the magnetic moment of the composite free layer 400 is no longer in-plane. For example, the decreasing trend in the graph of FIG. 6 suggests that four or more repeats of the superlattice structure would make the effective magnetization composite free layer 400 negative, or out-of-plane.

Figure 7:
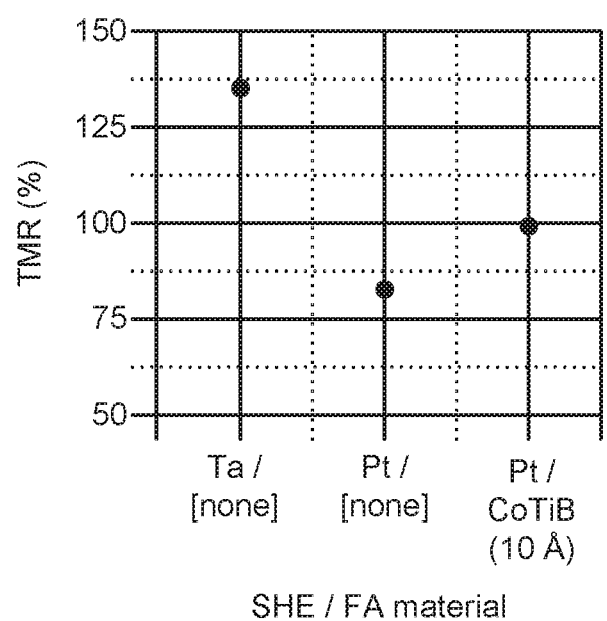
FIG. 7 is a graph illustrating tunnel magnetoresistance for embodiments of a magnetic tunnel junction.

FIG. 7 is a graph depicting tunnel magnetoresistance (TMR) for embodiments of a magnetic tunnel junction. As described above, TMR may refer to the difference between the higher antiparallel resistance and the lower parallel resistance of an MTJ, expressed as a percentage of the lower parallel resistance. Higher TMR, in various embodiments, corresponds to a more distinct difference between the antiparallel and parallel states, and increasing TMR may facilitate decreasing read currents and/or voltages. The graph in FIG. 7 depicts TMR in the absence of a PMA-inducing layer 404, so that the crystal structure of the in-plane anisotropy free layer 408 is affected by the SHE layer 402 and/or the ferromagnetic amorphous layer 406.

In the depicted graph, the TMR for an MTJ with a tantalum SHE layer 402 and no ferromagnetic amorphous layer 406 is above 125%. By contrast, the TMR for an MTJ with a platinum SHE layer 402 and no ferromagnetic amorphous layer 406 is below 100%, and closer to 75%. Face-centered cubic structure for platinum may cause mis-crystallization of the in-plane anisotropy free layer 408 during annealing, leading to the reduction in TMR. However, the introduction of a 10 angstrom thick CoTiB ferromagnetic amorphous layer 406 brings TMR with the platinum SHE layer 402 back up to approximately 100%. Thus, a decrease in TMR due to mis-crystallization may be adequately prevented or mitigated by the ferromagnetic amorphous layer 406.

Figure 8:
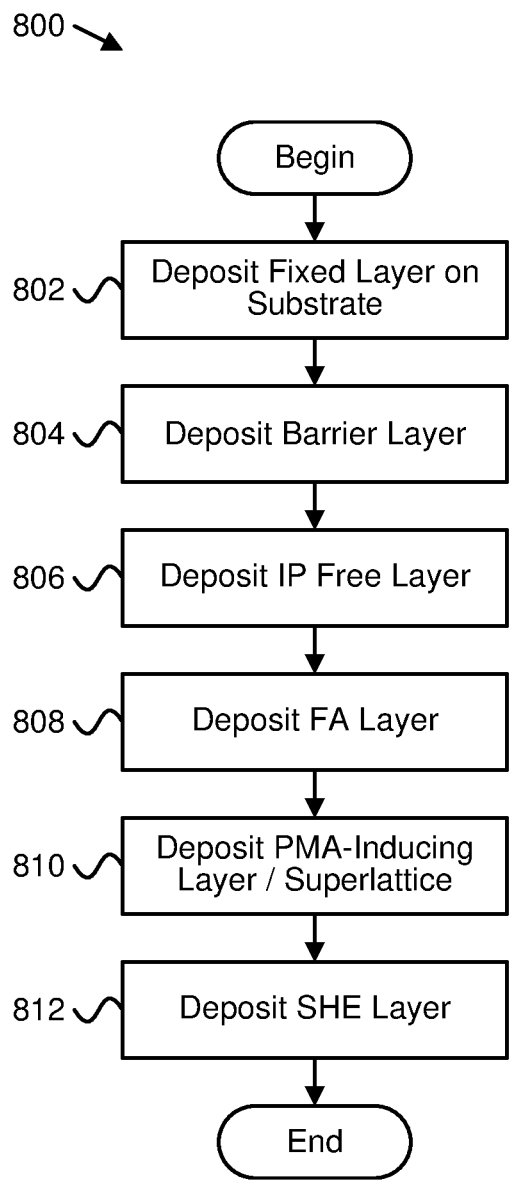
FIG. 8 is a schematic flow chart diagram illustrating one embodiment of a method for making a magnetic tunnel junction.

FIG. 8 is a schematic flow chart diagram illustrating one embodiment of a method 800 for making a magnetic tunnel junction. The method 800 begins, and a manufacturer deposits 802 a fixed layer 412 on a substrate. The manufacturer deposits 804 a barrier layer 410 on the fixed layer 412. The manufacturer deposits 806 an in-plane anisotropy free layer 408 on the barrier layer 410. The manufacturer deposits 808 a ferromagnetic amorphous layer 406 on the in-plane anisotropy free layer 408. The manufacturer deposits 810 a PMA-inducing layer 404 or superlattice on the ferromagnetic amorphous layer 406. The manufacturer deposits 812 a spin Hall effect layer 402 on the PMA-inducing layer 404, and the method 800 ends.

Figure 9:
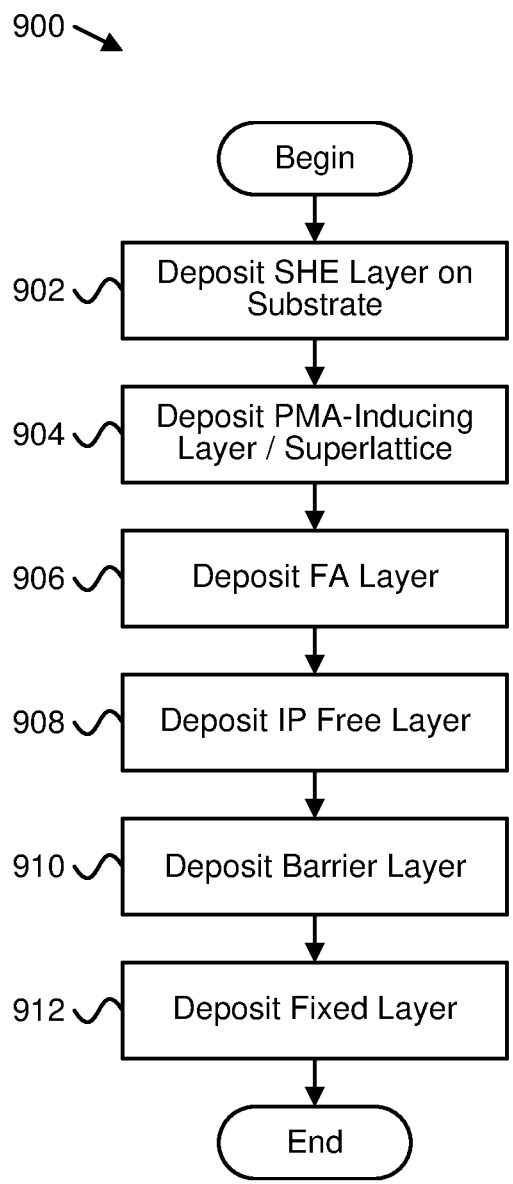
FIG. 9 is a schematic flow chart diagram illustrating another embodiment of a method for making a magnetic tunnel junction.

FIG. 9 is a schematic flow chart diagram illustrating another embodiment of a method 900 for making a magnetic tunnel junction. The method 900 begins, and a manufacturer deposits 902 a spin Hall effect layer 402 on the substrate. The manufacturer deposits 904 a PMA-inducing layer 404 on the spin Hall effect layer 402. The manufacturer deposits 906 a ferromagnetic amorphous layer 406 on the PMA-inducing layer 404. The manufacturer deposits 908 an in-plane anisotropy free layer 408 on the ferromagnetic amorphous layer 406. The manufacturer deposits 910 a barrier layer 410 on the in-plane anisotropy free layer 408. The manufacturer deposits 912 a fixed layer 412 on the barrier layer 410, and the method 900 ends.

A means for storing data in a composite free layer 400, in various embodiments, may include an in-plane anisotropy free layer 408, a ferromagnetic material, a ferromagnetic alloy, a CoFeB alloy, or the like. Other embodiments may include similar or equivalent means for storing data in a composite free layer 400.

A means for permanently inducing a perpendicular magnetic anisotropy (PMA) for the composite free layer 400, in various embodiments, may include a PMA-inducing layer 404, a superlattice, a rare earth and transition metal alloy, an $L1_0$-phase alloy, or the like. Other embodiments may include similar or equivalent means for inducing PMA in in a composite free layer 400.

A means for separating the means for storing data from the means for permanently inducing a PMA, in various embodiments, may include a ferromagnetic amorphous layer 406, one or more ferromagnetic elements, one or more glass-forming elements, one or more stabilizing elements for preventing migration of the one or more glass-forming elements, a CoTiB alloy, a CoFeBTa alloy, or the like. Other embodiments may include similar or equivalent means for separating the means for storing data from the means for permanently inducing a PMA.

A means for producing a spin current to change the orientation of an in-plane magnetic moment for the composite free layer 400, in various embodiments, may include an SHE layer 402, a tantalum layer, a platinum layer, a write word line, a bit line, a word line driver, a power supply, or the like. Other embodiments may include similar or equivalent means for producing a spin current.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a magnetic tunnel junction for storing data, the magnetic tunnel junction comprising a fixed layer, a barrier layer, and a composite free layer, the barrier layer disposed between the fixed layer and the composite free layer, the composite free layer comprising:
   an in-plane anisotropy free layer;
   a perpendicular magnetic anisotropy (PMA) inducing layer disposed such that the in-plane anisotropy free layer is between the barrier layer and the PMA-inducing layer, the PMA-inducing layer reducing an effective magnetization of the composite free layer; and
   a ferromagnetic amorphous layer disposed between the in-plane anisotropy free layer and the PMA-inducing layer.

2. The apparatus of claim 1, wherein the ferromagnetic amorphous layer comprises an alloy of cobalt, titanium, and boron.

3. The apparatus of claim 1, wherein the ferromagnetic amorphous layer comprises an alloy of cobalt, iron, boron, and tantalum.

4. The apparatus of claim 1, wherein a thickness of the PMA-inducing layer is selected such that a total magnetic moment of the composite free layer is in-plane.

5. The apparatus of claim 1, wherein the PMA-inducing layer reduces the effective magnetization of the composite free layer by a factor of five to ten.

6. The apparatus of claim 1, wherein the PMA-inducing layer comprises one or more of a superlattice of alternating cobalt and platinum layers, a rare earth and transition metal alloy, and an $L1_0$-phase alloy.

7. The apparatus of claim 1, wherein PMA-inducing layer comprises a superlattice of alternating cobalt and platinum layers, the superlattice comprising three cobalt layers and three platinum layers.

8. The apparatus of claim 1, wherein the ferromagnetic amorphous layer comprises an alloy of one or more ferromagnetic elements, one or more glass-forming elements, and one or more stabilizing elements for preventing migration of the one or more glass-forming elements.

9. The apparatus of claim 8, wherein the one or more ferromagnetic elements comprise one or more of iron and cobalt, the one or more glass-forming elements comprise boron, and the one or more stabilizing elements comprise one or more of tantalum and titanium.

10. The apparatus of claim 8, wherein the alloy comprises ten atomic percent or more of the one or more glass-forming elements, and five atomic percent or less of the one or more stabilizing elements.

11. The apparatus of claim 1, further comprising a spin Hall effect layer configured such that an in-plane electric current within the spin Hall effect layer causes a spin current in the composite free layer.

12. The apparatus of claim 11, wherein the PMA-inducing layer reduces a current density for the in-plane electric current to between one million and ten million amperes per square centimeter.

13. A system comprising:
a magnetoresistive random access memory (MRAM) die, the MRAM die comprising a plurality of magnetic tunnel junctions, wherein a magnetic tunnel junction comprises a reference layer, a barrier layer, and a composite free layer, the barrier layer disposed between the reference layer and the composite free layer, the composite free layer comprising:
an in-plane anisotropy free layer in contact with the barrier layer;
a ferromagnetic amorphous layer in contact with the in-plane anisotropy free layer; and
a perpendicular magnetic anisotropy (PMA) inducing layer in contact with the ferromagnetic amorphous layer, the PMA-inducing layer reducing a current density for an in-plane current within a spin Hall effect layer.

14. The system of claim 13, wherein a thickness of the PMA-inducing layer is selected such that the PMA-inducing layer reduces an effective magnetization of the composite free layer, and such that a total magnetic moment of the composite free layer is in-plane.

15. The system of claim 13, wherein a magnetic tunnel junction is coupled to the spin Hall effect layer such that the in-plane electric current within the spin Hall effect layer causes a spin current in the composite free layer.

16. The system of claim 13, wherein the ferromagnetic amorphous layer comprises an alloy of one or more ferromagnetic elements, one or more glass-forming elements, and one or more stabilizing elements for preventing migration of the one or more glass-forming elements.

17. The system of claim 16, wherein the one or more ferromagnetic elements comprise one or more of iron and cobalt, the one or more glass-forming elements comprise boron, and the one or more stabilizing elements comprise one or more of tantalum and titanium.

18. The system of claim 16, wherein the alloy comprises ten atomic percent or more of the one or more glass-forming elements, and five atomic percent or less of the one or more stabilizing elements.

19. An apparatus comprising:
means for storing data in a composite free layer for a magnetic tunnel junction, based on an orientation of an in-plane magnetic moment for the composite free layer;
means for permanently inducing a perpendicular magnetic anisotropy (PMA) for the composite free layer, the means for permanently inducing a PMA reducing an effective magnetization of the composite free layer
means for separating the means for storing data from the means for permanently inducing a PMA, such that a crystal structure of the means for storing data is unaffected by the means for permanently inducing a PMA.

20. The apparatus of claim 19, further comprising means for producing a spin current to change the orientation of the in-plane magnetic moment for the composite free layer.

* * * * *